United States Patent [19]

Fincke

[11] 3,969,681

[45] July 13, 1976

[54] FAST ELECTRONIC TUNING OF HIGH POWER CIRCUITS FOR VHF-UHF POWER AMPLIFIER AT HIGH-EFFICIENCY

[75] Inventor: George Fincke, W. Allenhurst, N.J.

[73] Assignee: The United States of America as represented by the Secretary of the Army, Washington, D.C.

[22] Filed: Aug. 15, 1974

[21] Appl. No.: 497,788

[52] U.S. Cl. ................................ 330/56; 331/101; 331/179
[51] Int. Cl.² .......................................... H03F 3/60
[58] Field of Search ............... 330/53, 56; 331/181, 331/101, 179; 334/41; 325/172, 465

[56] References Cited
UNITED STATES PATENTS

| | | | |
|---|---|---|---|
| 2,681,953 | 6/1954 | Bradburd | 330/56 |
| 3,414,833 | 12/1968 | Tolliver | 330/53 |
| 3,417,351 | 12/1968 | Di Piazza | 331/179 |
| 3,614,665 | 10/1971 | Weller | 331/101 |

OTHER PUBLICATIONS

Microwaves, "Digital Tuning Imposes Will on Cavity Oscillators" July 1969.

Primary Examiner—John Kominski
Attorney, Agent, or Firm—Nathan Edelberg; Sheldon Kanars; Kenneth Murphy

[57] ABSTRACT

Two embodiments are disclosed of a system for the fast tuning of high power amplifier circuits. In one embodiment a strip line resonating circuit is selectively tuned by the actuation of selected ones of a plurality of PIN diodes which interconnect a relatively high impedance of strip line circuit with a strip line circuit having a lower characteristic impedance. In the second embodiment a coaxial cavity is terminated in an output transmission line. The cavity and the output transmission line are separated by an array of shorting stubs, each of which is selectively energizable by a suitably located PIN diode.

1 Claim, 3 Drawing Figures ns the setting on.

FAST ELECTRONIC TUNING OF HIGH POWER CIRCUITS FOR VHF-UHF POWER AMPLIFIER AT HIGH-EFFICIENCY

The invention described herein may be manufactured and used by or for the Government for governmental purposes without the payment of any royalties thereon or therefor.

FIELD OF THE INVENTION

This invention relates to high power high frequency amplifiers and particularly to high power high frequency amplifiers employable over a broadband of frequencies.

BACKGROUND OF THE INVENTION

There are many needs in the electronics industry for broadband high power amplifiers. Many broadband high power amplifiers employ high frequency planar triodes as the active device. Such amplifiers have excellent resistance to intermodulation distortion and harmonics since the basic device (the high frequency planar triode) is an extremely linear device. It has been found, however, that the efficiency of such amplifiers is very low.

Higher efficiency broadband high power amplifiers have been built employing the interconnection of a multiplicity of semi-conductor amplifying devices. It has been found, however, that the basic semi-conductor devices are not nearly as linear as the high frequency planar triode and therefore a high degree of intermodulation distortion and harmonic generation results.

Therefore, it is an object of this invention to provide a new and improved high power, high frequency amplifier.

It is another object of this invention to provide a high power, high frequency amplifier with a high degree of efficiency and a low susceptability to intermodulation distortion and harmonic generation.

BRIEF DESCRIPTION OF THE INVENTION

With these and other objects in view, the present invention contemplates an amplifier which employs a high frequency planar triode having a selectively tunable output circuit which includes a distributed parameter impedance element connected to the output of the triode, an output transmission line for driving a load, a plurality of PIN diodes, each of which is arranged to connect the distributed parameter impedance element to the output transmission line when the respective PIN diodes are energized, and apparatus is provided for selectively energizing PIN diodes.

For the VHF broadband system the PIN diodes are located at discrete points along a strip-line transmission line anode tank circuit and are switched on one at a time to vary the strip-line length and thus the inductive susceptance of the circuit. For UHF, a TEM mode, coaxial cavity circuit is employed. This circuit incorporates six radial, conductive spokes located at the low impedance end of the cavity which are switched into the circuit with PIN diodes in a variety of combinations.

DESCRIPTION OF THE DRAWINGS

A more complete understanding of the invention can be had by reference to the following detailed description of the invention and drawings in which.

DETAILED DESCRIPTION OF THE INVENTION

Figure 1:
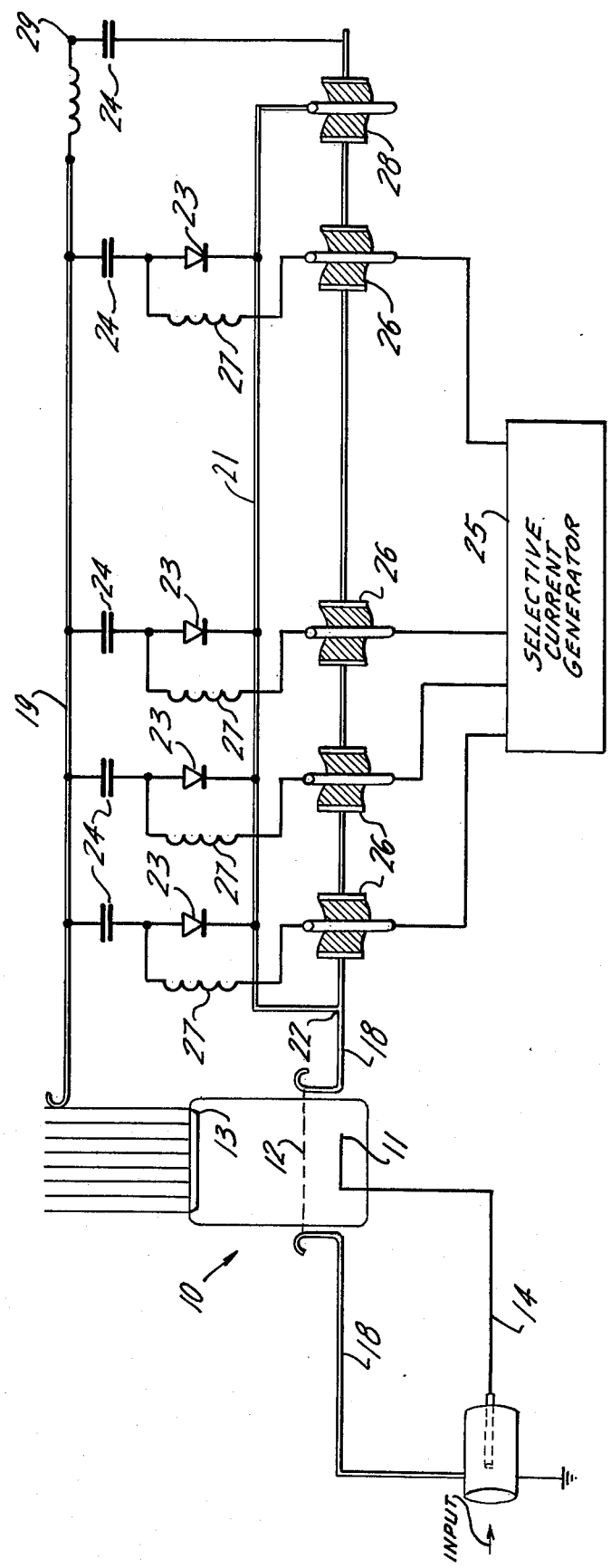
FIG. 1 is a schematic view of a strip-line system constructed in accordance with this invention.

Referring now to FIG. 1, we see a high-frequency planar triode 10 having a cathode 11, a grid 12 and a plate or anode 13. Signals are applied to the cathode 11 of the triode 10 via lead 14. A ground plane 18 is attached to the grid 12 to provide the referenced ground potential thereto and to form the ground plane for the strip line transmission lines of the output circuit. A strip line conductor 19 is electrically connected to the anode 13 and forms a transmission line having a characteristic impedance of 200 ohms with the ground plane 18. A second strip line conductor 21 is connected to the ground plane 18 at a point 22 and forms an output transmission line having a characteristic impedance of 50 ohms with respect to the ground plane 18.

A plurality of PIN diodes, each designated 23, connect a point on the strip line conductor 19 to a point on the strip line conductor 21 via a DC blocking capacitor 24.

A PIN diode is a two-terminal device which exhibits an impedance of 20,000 ohms when no forward bias is applied thereto. When the PIN diode is forward biased (typically with 1 volt and approximately ½ an amp) an impedance of 0.5 ohms is exhibited. Therefore, it can be seen that when applying impedances in the neighborhood of 200 ohms and 50 ohms, the "off" impedance of the PIN diode is an open circuit and the "on" impedance thereof is essentially a short circuit. PIN diodes are particularly suitable for high-frequency applications since they maintain their characteristics well at high frequencies.

A selective current generator 25 is employed to provide forward bias current to one of the diodes 23 in accordance with the setting thereof. The current from the selective current generator 25 passes through feedthroughs 26 and AC blocking inductors 27 to drive the PIN diodes 23.

The output of the output transmission line formed by conductor 21 is provided at an output connector 28. D.C. is applied to the plate 13 of the triode 10 on terminal 29.

In operation, the strip transmission line employing the conductor 19 is the output tuning circuit of the triode 10. The PIN diode, when forward biased, shorts this transmission line so that the resonant frequency of the transmission line, including conductor 19, is determined by which of the PIN diodes is energized. It should be remembered that a shorted transmission line is resonant at a frequency having a wavelength which the length of the shorted transmission line is a quarter of.

In accordance with this invention, the strip transmission line, including the conductor 19, is shorted not to a ground plane as would be conventional, but rather to the conductor 21 which forms a part of the output transmission line. In this way, energy is coupled directly from the conductor 19 to the conductor 21. The point on the conductor 19, to which the anode of each of the PIN diodes 23 is connected, determines the resonant frequency of the output circuit. The point on the conductor 21, to which the cathodes of the PIN diode is connected, determines the impedance matching between the strip transmission line including the conductor 19 and the output transmission line including the conductor 21. In practice it has been found that the anodes of the PIN diodes 23 should be twice as far from the plate of the triode 10 as the cathodes are from the short 22. In one embodiment of this invention, the anodes and cathodes of the PIN diode have been movably mounted on conductors 19 and 21 to allow tuning of the frequency and impedance matching thereof.

It should be noted that the distances discussed above are not totally independent of each other. For example, the portion of the output transmission line to the left of the PIN diode, energized at any particular point, affects the resonant frequency of the plate circuit. This, however, is a second order effect and can be taken into account when designing circuits in accordance with the teachings of this invention.

Figure 2:
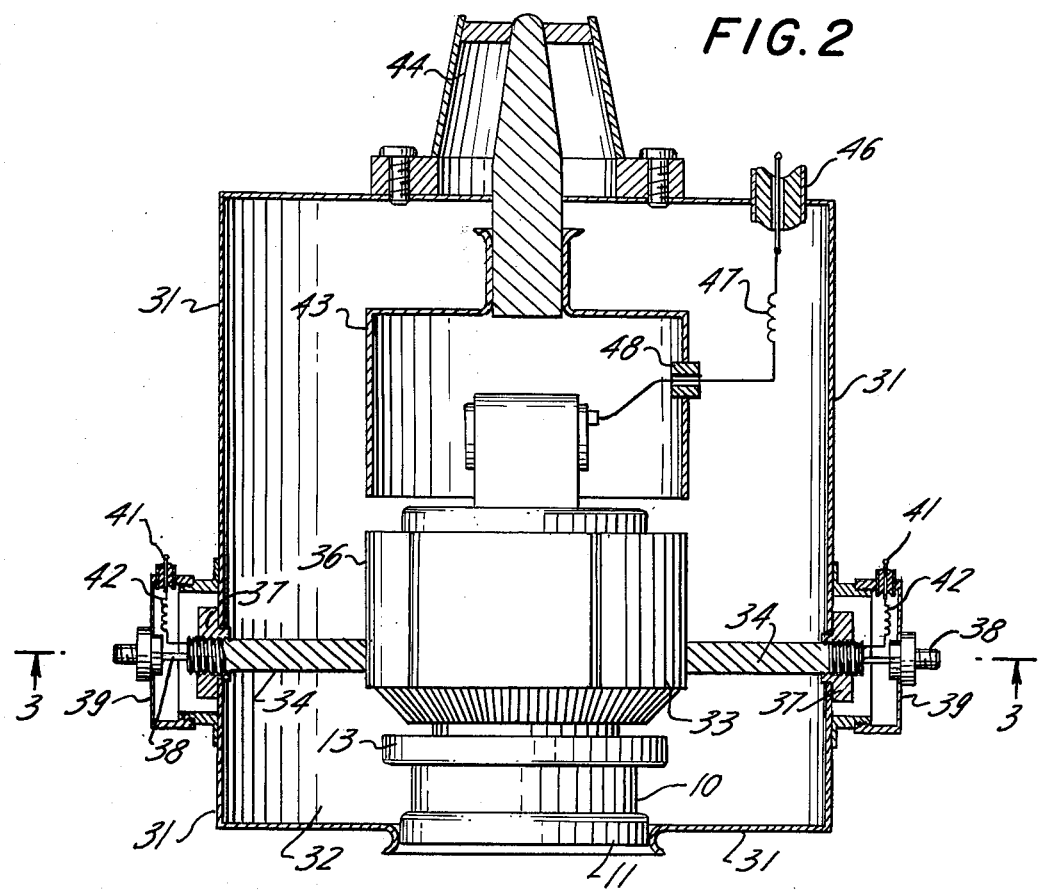
FIG. 2 is a sectional elevation view of a coaxial cavity and tuning circuit constructed in accordance with the teachings of this invention and FIG. 3 is a sectional view of the configuration shown in FIG. 2.
Figure 3:
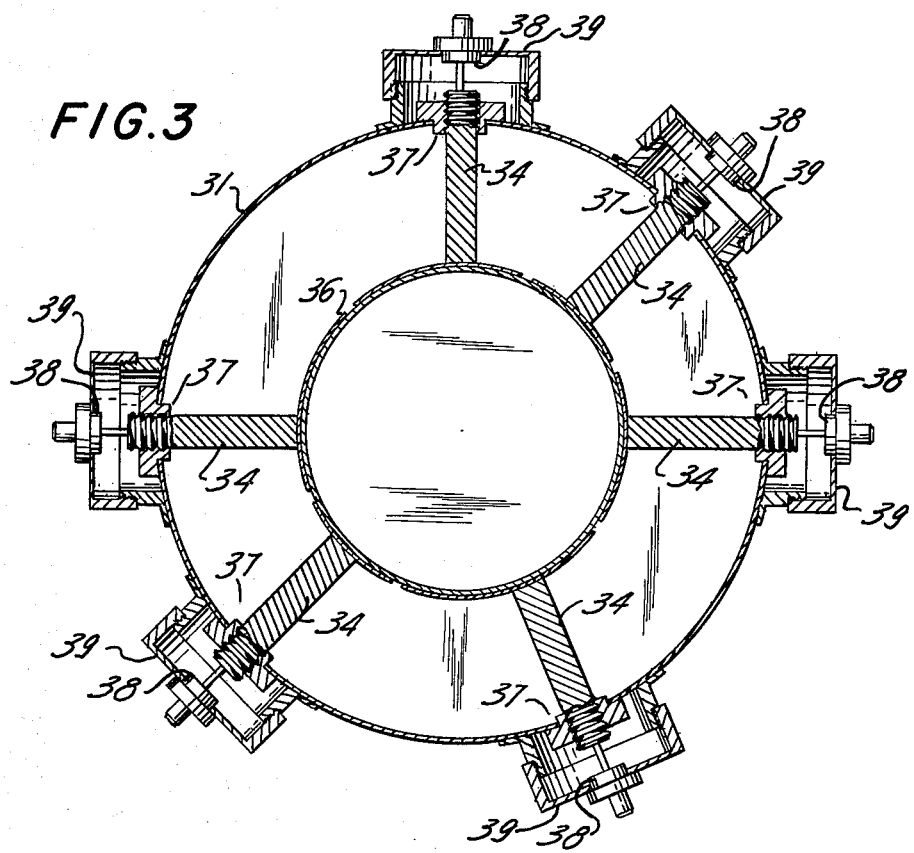

Referring now to FIGS. 2 and 3, we see a coaxial embodiment of the output tuning system as shown in FIG. 1. The strip line version as shown in FIG. 1 is useful for VHF systems while the coaxial version is more applicable for UHF applications. In FIG. 2, only the grid and anode connections of the triode 10 are shown. The grid 11 is connected to a conductor 31 which forms a portion of a coaxial tuning cavity 32. The anode 13 connected to a conductor 33 serves as the center conductor for the coaxial cavity.

Six spaced radial conductive rods, each designated 34, are the tuning elements which define the end of the coaxial cavity 32. The conducting rods 34 are radially disposed and unequally spaced. A thin insulating layer 36 separates the center conductor 33 from the conducting rods 34, forming a capacitive coupling therebetween.

The conducting rods 34 pass through the conductor 31 and are insulated therefrom by members 37. Each of the conductors 34 has, as the terminus thereof, a PIN diode 38 with the anode thereof connected to the conducting rod 34. The cathode of each PIN diode is returned to ground through a conducting structure 39 which includes a cover plate and additional conductive material which connects it directly to the conductor 31.

Each of the conducting structures 39 has a feed-through 41 which brings a lead to an inductor 42 for energizing the anode of the PIN diode. In operation, a selective current generator is connected up to energize the PIN diodes 38 through the feed-throughs 41 and conductors 42.

Referring in particular to FIG. 2, we see that above the conducting rods 34, the conductor 31 continues to form the outside of a coaxial system. A center conductor 43 is mounted therein to complete the same. The coaxial structure, including conductos 31 and 33 above the conducting rods 34, and conductor 43 form an output transmission line for coupling energy from the cavity 32 to an output connector 44. Power is brought to the anode 13 of the triode 10 through a feed-through 46, inductor 47 and feed-through 48 and the conductors associated therewith.

In operation, the output frequency of the triode 10 is tuned by selectively energizing combinations of the PIN diode 38 altering the termination of the cavity 32 thereby.

It should be understood that while this invention has been disclosed with respect to two specific emobidments thereof, numerous additional embodiments will become obvious to those of ordinary skill in the art in light thereof.

What is claimed is:

1. A selectively tunable output circuit for an ultra-high frequency power amplifying device comprising:
    a tunable, coaxial, TEM mode cavity having cylindrical center and outer conductors;
    a triode amplifying device located within said center conductor of said tunable coaxial cavity, said triode having its grid connected to said outer conductor and its anode connected to said center conductor;
    at least six radially disposed, unequally spaced selectively positioned conductive tuning rods, capacitance coupled to said center conductor and insulated from and extending outward through said cylindrical outer conductor;
    a PIN diode at the outer end of each of said radial conductive rods, each diode arranged to short said radial rod to said outer conductor when said diodes are biased into the conductive state; and
    means to selectively bias said diodes to thereby change the tuning of said device.

* * * * *